(12) United States Patent
Marui et al.

(10) Patent No.: US 7,763,910 B2
(45) Date of Patent: Jul. 27, 2010

(54) SEMICONDUCTOR DEVICE AND MANUFACTURING METHOD

(75) Inventors: Toshiharu Marui, Tokyo (JP); Fumihiko Toda, Tokyo (JP); Shinichi Hoshi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 12/382,664

(22) Filed: Mar. 20, 2009

(65) Prior Publication Data
US 2009/0242937 A1    Oct. 1, 2009

(30) Foreign Application Priority Data
Apr. 1, 2008    (JP) .............................. 2008-094602

(51) Int. Cl.
*H01L 29/778*    (2006.01)
(52) U.S. Cl. ............... 257/192; 257/409; 257/E29.246; 257/E21.409
(58) Field of Classification Search ................. 257/192, 257/E29.246, E21.409, 409
See application file for complete search history.

(56) References Cited

FOREIGN PATENT DOCUMENTS

JP    2004-200248    7/2004

OTHER PUBLICATIONS

Ochiai et al., 'AlGaN/GaN Heterostructure Metal-Insulator-Semiconductor High-Electron-Mobility Transistors with $Si_3N_4$ Gate Insulator', Japanese Journal of Applied Physics, vol. 42, pp. 2278-2280, 2003, p. 2 of specification.

*Primary Examiner*—Tan N Tran
(74) *Attorney, Agent, or Firm*—Rabin & Berdo, PC

(57) ABSTRACT

A semiconductor device has source and drain electrodes formed on a substrate, a gate insulation film formed on the substrate between the source and drain electrodes, and a gate electrode formed on the gate insulation film. These elements are all covered by a dielectric sub-insulation film. An opening is formed in the sub-insulation film, partially exposing the gate electrode. A field plate extends from the top of the gate electrode down one side of the gate electrode as far as the sub-insulation film covering the gate insulation film, filling the opening. The thickness of the sub-insulation film can be selected to optimize the separation between the field plate and the substrate for the purpose of reducing current collapse by reducing electric field concentration at the edge of the gate electrode.

11 Claims, 7 Drawing Sheets

SEMICONDUCTOR DEVICE AND MANUFACTURING METHOD

BACKGROUND OF THE INVENTION

1. Field of the Invention

The present invention relates to a semiconductor device and a method of manufacturing it, more particularly to a high electron mobility transistor having a metal-insulator-semiconductor structure and a field plate.

2. Description of the Related Art

A high electron mobility transistor (HEMT) is a type of field-effect transistor in which current flows in a two-dimensional electron gas (2DEG). One known HEMT structure has a substrate including a doped gallium nitride (GaN) electron channel layer and an aluminum gallium nitride (AlGaN) electron supply layer. Source, drain, and gate electrodes are formed on the surface of the AlGaN electron supply layer. A 2DEG layer is formed within the electron channel layer by piezo polarization and/or spontaneous polarization of the heterojunction interface between the electron channel layer and the electron supply layer. The electron supply layer has low resistance in its thickness direction and high resistance in the transverse direction, so current flowing between the source and drain electrodes moves in the 2DEG layer. HEMTs of this type combine high switching speeds with high-temperature and high-power operating capabilities, making them promising candidates for high-performance electronic devices.

During alternating-current operation of this type of HEMT, however, a negative charge builds up on the surface of the electron supply layer, causing a so-called current collapse in which the maximum drain current is less than the maximum drain current in direct-current operation.

It is known that the current collapse can be reduced by a silicon nitride (SiN) surface passivation film fifty to one hundred nanometers (50-100 nm) thick, for example, formed on exposed surfaces of the substrate and the source, gate, and drain electrodes. The presence of an SiN passivation film on the upper surface of the electron supply layer of an HEMT, however, has an adverse effect on the source-drain breakdown voltage of the device.

In U.S. Patent Application Publication No. 20060102929 (Japanese Patent Application Publication No. 2004-200248), Okamoto et al. describe an HEMT in which the SiN passivation is a thin film that does not cover the gate electrode. A thicker silicon dioxide ($SiO_2$) passivation film is formed on the SiN passivation film, also leaving the gate electrode uncovered. The top of the gate electrode is extended like a canopy over the passivation films, toward the drain, to reduce the concentration of the electric field at the edge of the gate electrode, thereby improving the source-drain breakdown voltage.

The devices described above are metal-semiconductor (MES) HEMTs, in which the gate electrode is in contact with the surface of the substrate, forming a Schottky junction that must be reverse-biased to prevent unwanted current flow from the gate electrode into the substrate. Even in the reverse-biased state, however, some gate current leaks through. An alternative to the MES-HEMT structure is the metal-insulator-semiconductor (MIS) HEMT structure, in which the gate electrode is separated from the substrate by a thin gate insulation film that greatly reduces the gate leakage current and enables the gate and substrate to be forward-biased.

The gate insulation film in a MIS-HEMT has also been reported to mitigate current collapse, as discussed by Ochiai et al. in 'AlGaN/GaN Heterostructure Metal-Insulator-Semiconductor High-Electron-Mobility Transistors with $Si_3N_4$ Gate Insulator', *Japanese Journal of Applied Physics*, Vol. 42, p. 2278 (2003). In a MIS-HEMT, however, it is difficult to use the field plate disclosed by Okamoto et al. to further mitigate current collapse, for the following reason.

In the fabrication of a MES-HEMT with a field plate, a passivation film is first formed on the entire surface of the substrate, then selectively removed to expose substrate areas on which the source, gate, and drain electrodes are formed. The field plate is then formed, covering the upper surface of the gate electrode, the side surface of the gate electrode facing the drain electrode, and the upper surface of the surface passivation film extending from the gate electrode toward the drain.

The effect of the field plate in reducing field concentration depends on the distance from the field plate to the substrate. The distance is equal to the thickness of the passivation film, or the combined thickness of the passivation films if there are multiple passivation films. The distance from the field plate to the substrate can be optimized by adjusting this thickness.

In the fabrication of a MIS-HEMT, the substrate is covered by a gate insulation film instead of a surface passivation film. The gate insulation film must be thin to provide an adequate field effect from the gate electrode; it cannot be thickened to adjust the distance from a field plate to the substrate. If the field plate is formed as an extension of the top of the gate electrode over the gate insulation film, then the distance from the field plate to the substrate cannot be adjusted to obtain the optimum reduction in field concentration. In general the field plate will be too close to the substrate.

SUMMARY OF THE INVENTION

One object of the present invention is to optimize the effect of a field plate in reducing current collapse in a MIS-HEMT.

The invention provides a semiconductor device having a substrate on which two main electrodes (a source electrode and a drain electrode) are formed. A gate insulation film is formed on the surface of the substrate between the two main electrodes. A gate electrode is formed on the gate insulation film between the two main electrodes. The gate electrode has a top surface, two sides facing the main electrodes, and a vertical thickness measured from the top surface to the gate insulation film.

A sub-insulation film having a thickness less than the vertical thickness of the gate electrode is formed so as to continuously cover the exposed surfaces on the substrate, including the surface of the gate insulation film and the surfaces of the source, gate, and drain electrodes. An opening is formed in the sub-insulation film, partially exposing the gate electrode. A field plate is formed that extends from the top surface of the gate electrode down the side of the gate electrode facing one of the main electrodes, as far as the surface of the sub-insulation film covering the gate insulation film, filling the opening.

Regardless of the thickness of the gate insulation film, the thickness of the sub-insulation film can be selected to optimize the separation between the field plate and the substrate for the purpose of reducing current collapse by reducing the field concentration at the periphery of the gate electrode.

DETAILED DESCRIPTION OF THE INVENTION

Figure 1:
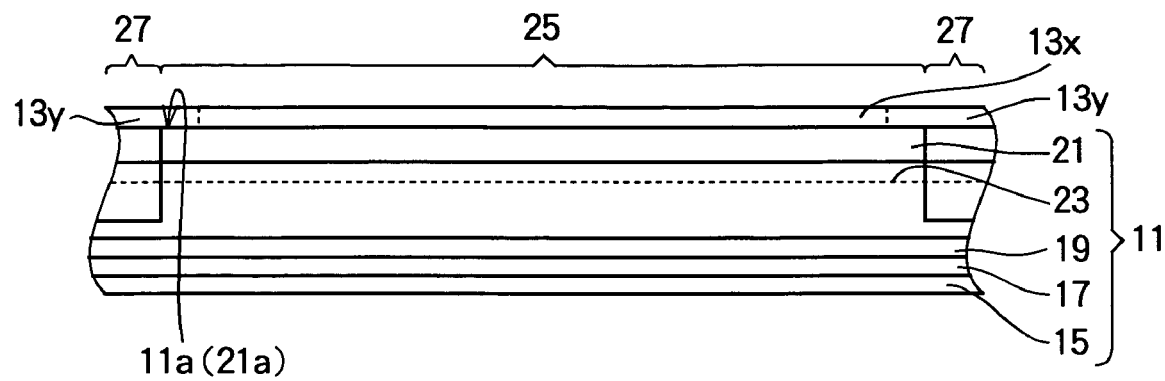
FIGS. 1 to 6 are sectional views showing steps in the fabrication of an HEMT according to a first embodiment of the invention.

Embodiments of the invention will now be described with reference to the attached drawings, in which like elements are indicated by like reference characters. The description will refer to well known semiconductor fabrication processes such as metalorganic chemical vapor deposition (MOCVD), molecular beam epitaxy (MBE), ion implantation, plasma chemical vapor deposition (CVD), electron beam (EB) deposition, photolithography, reactive ion etching, wet etching, and dry etching, detailed descriptions of which will be omitted.

First Embodiment

The first embodiment provides a MIS-HEMT, and a MIS-HEMT fabrication method, in which a field plate is formed on a sub-insulation film that covers substantially all of the gate electrode. The fabrication method includes six steps which will be described with reference to FIGS. 1 to 6.

The substrate of the MIS-HEMT may in general be a silicon substrate, a silicon-on-insulator (SOI) substrate, or various other known types of semiconductor substrates, as called for by the device design. In the description below, the substrate 11 is a heterojunction substrate having an AlGaN layer formed on a GaN layer.

Referring to FIG. 1, the substrate 11 includes a base layer 15, a buffer layer 17, an un-intentionally-doped (UID) GaN layer 19, and a UID AlGaN layer 21. For simplicity, the UID notation will be omitted in referring to the GaN layer 19 and AlGaN layer 21 below. The base layer 15 is formed from sapphire or another appropriate material. The buffer layer 17 is a layer of aluminum nitride (AlN), GaN, or another appropriate material formed on the base layer 15 by MOCVD. The GaN layer 19 is formed on the buffer layer 17 as an electron channel layer; the AlGaN layer 21 is formed on the GaN layer 19 as an electron supply layer. The GaN layer 19 and AlGaN layer 21 may be formed by MOCVD or MBE. In this layered structure, the energy bandgap difference between the GaN layer 19 and AlGaN layer 21 causes a two-dimensional electron gas (2DEG) layer 23 to form in the GaN layer 19 near the interface with the AlGaN layer 21. The device region 25 of the substrate 11 is electrically isolated by implantation of argon ions, for example, from the surface of the AlGaN layer 21 to a level below the 2DEG layer 23 to form isolation regions 27.

A detailed description of the fabrication of the substrate 11 will be omitted as the fabrication of such substrates by MOCVD, MBE, ion implantation, etc. is well known. The six steps described below concern the formation of structures on the surface of the substrate 11.

In the first step, a gate insulation film 13 is formed on the upper surface 11a of the substrate 11, that is, on the upper surface 21a of the AlGaN layer 21, as shown in FIG. 1. The gate insulation film 13 is preferably an SiN film 5 nm thick, which may be formed by plasma CVD. The gate insulation film 13 may be formed either before or after the isolation regions 27.

Figure 2:
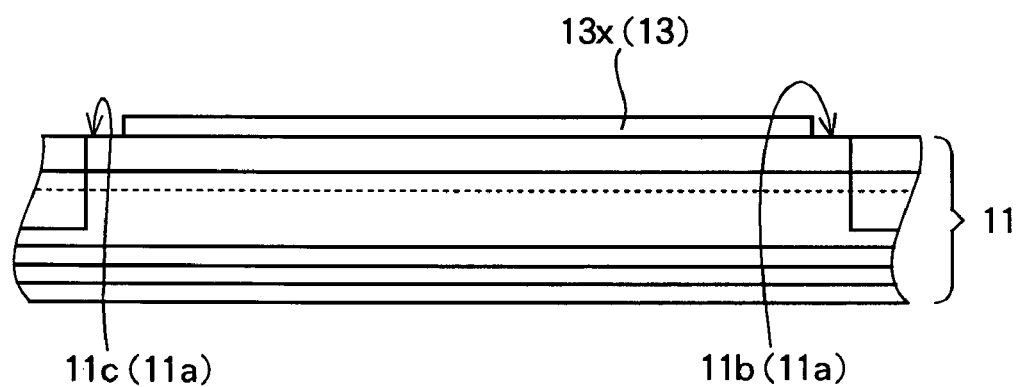

In the second step, the part 13y of the gate insulation film 13 in the regions where the source and drain electrodes will to be formed is removed down to the upper surface 11a of the substrate 11, leaving an exposed surface 11b and an exposed surface 11c on opposite sides of the remaining gate insulation film 13x, as shown in FIG. 2. This selective removal may be effected by photolithography and, for example, reactive ion etching, wet etching, or dry etching.

Figure 3:
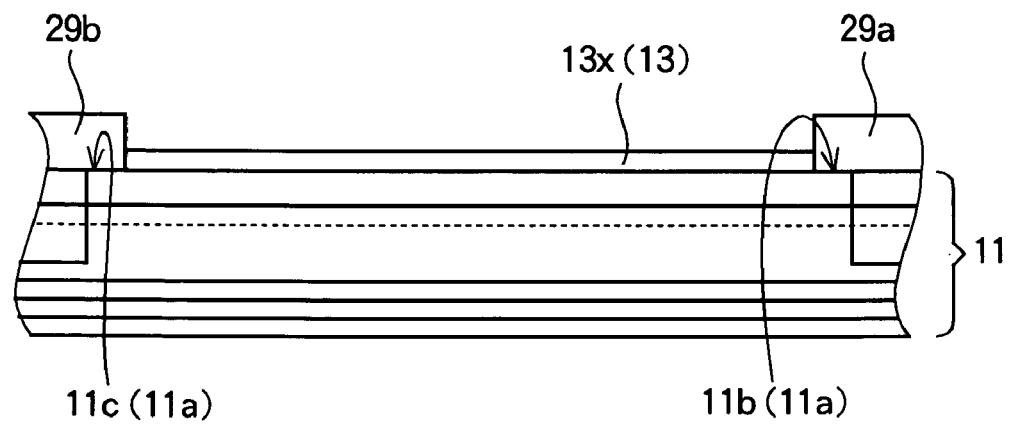

In the third step, two main electrodes 29a, 29b are formed on the respective exposed surfaces 11b, 11c as shown in FIG. 3, preferably by electron beam deposition of, for example, titanium (Ti) and aluminum (Al). The two main electrodes 29a, 29b are in ohmic contact with the upper surface 11a of the substrate 11, that is, with the upper surface 21a of the AlGaN layer 21 through the exposed surfaces 11b, 11c. When the MIS-HEMT is used, one of the main electrodes 29a, 29b functions as a source electrode and the other functions as a drain electrode.

Figure 4:
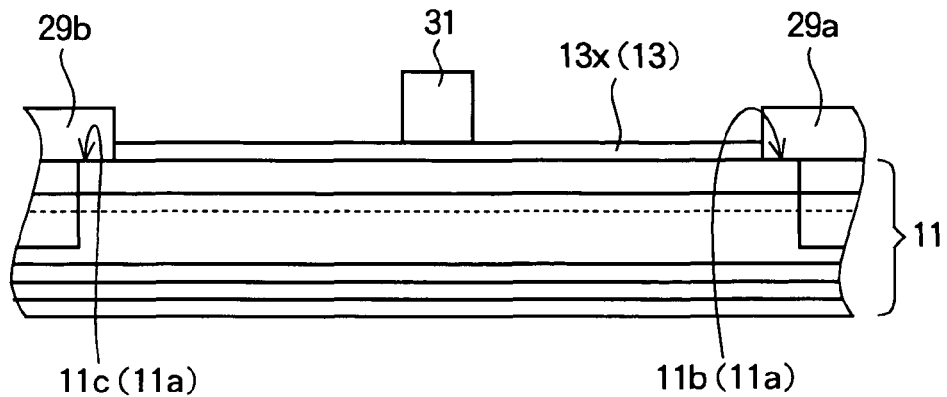

In the fourth step, a gate electrode 31 is formed on the gate insulation film 13x between the two main electrodes 29a, 29b as shown in FIG. 4 by electron beam deposition of, for example, nickel (Ni) and gold (Au).

Figure 5:
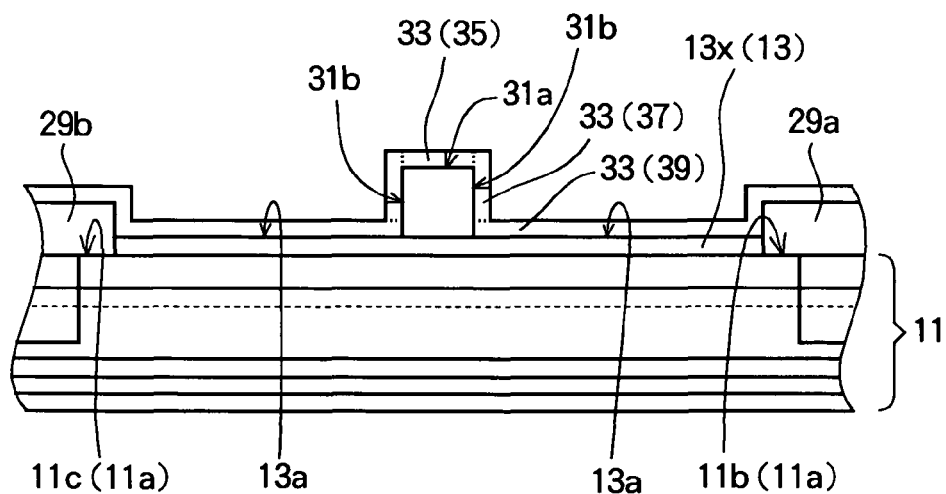

In the fifth step, a sub-insulation film 33 having a thickness less than the vertical thickness of the gate electrode 31 is formed over the entire surface of the substrate 11, covering the gate electrode 31 and the exposed surface 13a of the gate insulation film 13x as shown in FIG. 5. The sub-insulation film 33 is preferably a SiN film grown by plasma CVD. The sub-insulation film 33 includes first, second, and third parts, referred to below as first, second and third sub-insulation films. The first sub-insulation film 35 covers the upper surface 31a of the gate electrode 31. The second sub-insulation film 37 covers the two side surfaces 31b of the gate electrode 31 facing the main electrodes 29a, 29b. The third sub-insulation film 39 covers the exposed surface 13a of the gate insulation film 13x, as well as at least partially covering the main electrodes 29a, 29b, as shown, and exposed areas (if any) of the substrate 11 (not shown).

Figure 6:
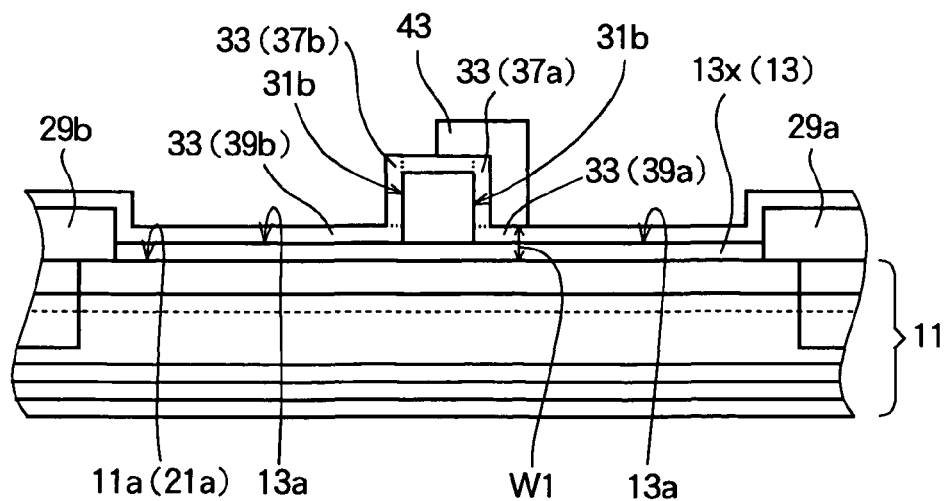

The purpose of forming the sub-insulation film 33 is to optimize the distance from the upper surface 11a of the substrate 11 to the field plate that will be formed in the following (sixth) step. As shown in FIG. 6, the field plate 43 will be formed on one side of the gate electrode 31, covering that one side and adjacent parts of the upper surface 31a of the gate electrode 31, and following the side of the gate electrode 31 down toward the gate insulation film 13x and substrate 11. The sub-insulation film 33 intervenes between the field plate and the gate electrode 31, and between the field plate and the surface 13a of the gate insulation film 13x.

The purpose of the field plate is to reduce current collapse by reducing the field concentration at the periphery of the gate electrode 31. To obtain this effect, it is necessary to optimize the distance from the field plate to the upper surface 11a of substrate 11. This is done by adjusting the total thickness W1 of the third sub-insulation film 39, which forms part of the sub-insulation film 33, and the gate insulation film 13x, which is the remaining part of the original gate insulation film 13. The total thickness W1 should be at least 50 nm, so if the gate insulation film 13x is 5 nm thick, the third sub-insulation film 39 may be as little as 45 nm thick. As described later, the total thickness W1 is more preferably about 150 nm, so if the gate insulation film 13x is 5 nm thick, the third sub-insulation film 39 is preferably about 145 nm thick.

Figure 7:
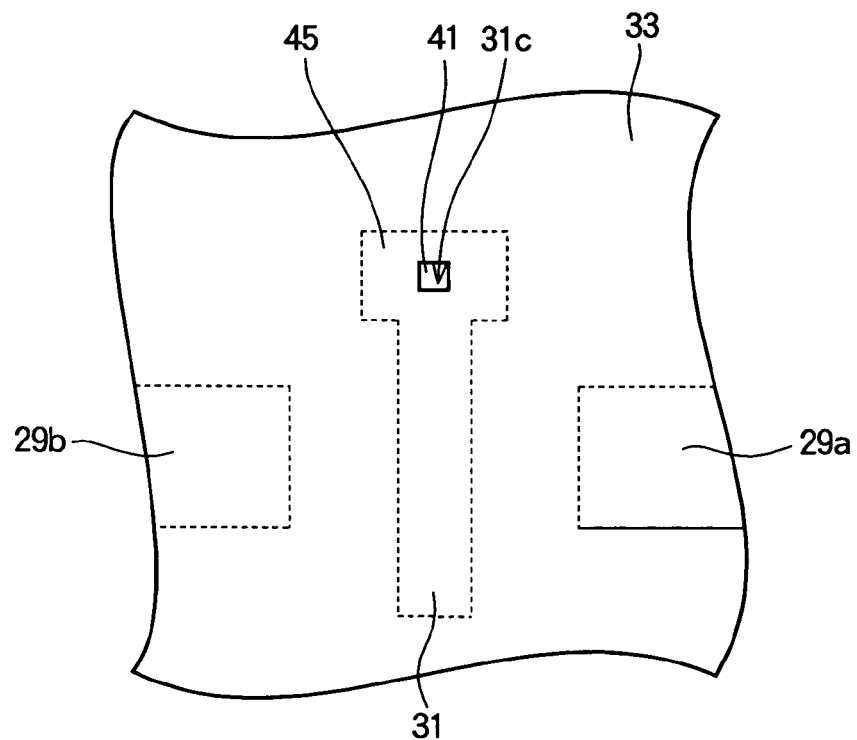
FIGS. 7 and 8 are plan views showing the step in FIG. 6.

In the sixth step, an opening 41 is formed in the first sub-insulation film 35 by dry etching, partially exposing the upper surface 31a of the gate electrode 31 as shown in FIG. 7. The field plate, when formed, will be electrically connected to the gate electrode 31 through this exposed surface 31c.

The opening 41 may be formed at any place within the region in which the field plate will be formed, but the gate electrode 31 is preferably elongated in the gate width direction and has an enlarged end or pad 45 as shown in FIG. 7, and the opening 41 is preferably formed on the pad 45.

Figure 8:
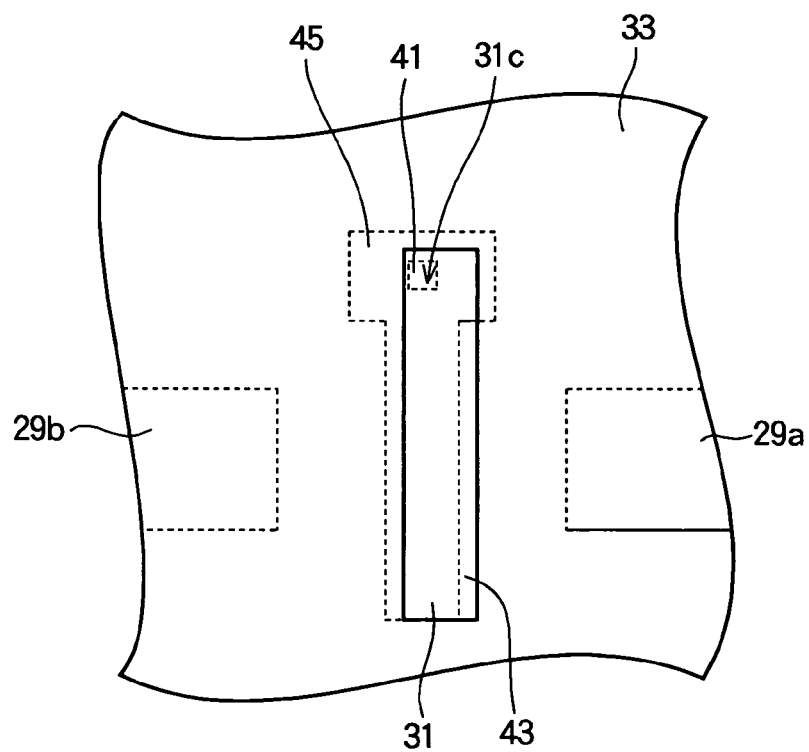

Next, after the opening 41 has been formed, the field plate 43 is formed as shown in FIGS. 6 and 8 by, for example, electron beam deposition of titanium (Ti), platinum (Pt), and gold (Au).

As described above, the field plate 43 is formed so as to integrally cover the second sub-insulation film 37 on one side of the gate electrode 31 and adjacent parts of the first sub-insulation film 35 and third sub-insulation film 39. In the drawings, the field plate 43 is formed on the side of the gate electrode 31 facing the first main electrode 29a, which may function as either the source electrode or the drain electrode. The field plate is separated from the gate electrode 31 by the second sub-insulation film 37a on this side and is separated from the gate insulation film 13x by the third sub-insulation film 39a on this side. The second sub-insulation film 37b and third sub-insulation film 39b on the opposite side of the gate electrode 31 are not covered by the field plate 43.

During the operation of a HEMT, electric field concentrations tend to occur in the region between the gate electrode and the drain electrode, so the field plate 43 is preferably formed on the side of the gate electrode that faces the drain electrode. If the first main electrode 29a will function as the drain, the field plate should be formed as shown in FIGS. 6 to 8. If the second main electrode 29b will function as the drain, the field plate 43 should be formed to cover the second sub-insulation film 37b and the adjacent parts of the first sub-insulation film 35 and third sub-insulation film 39b on that side (the left side in the drawing), instead of covering the second sub-insulation film 37a and third sub-insulation film 39a on the right side.

The field plate 43 is formed so as to fill in the opening 41 and make electrical contact with the exposed surface 31c of the gate electrode 31 at the bottom of the opening 41.

In the first embodiment, the field plate 43 is distant from the upper surface 11a of the substrate 11, that is, from the upper surface 21a of the AlGaN layer 21, by an amount equal to the total thickness W1 of the third sub-insulation film 39 and the gate insulation film 13x.

Since the sub-insulation film 33 is formed on the gate electrode 31 and gate insulation film 13x, and the field plate 43 is formed on the sub-insulation film 33, as best seen in FIG. 6, it is possible to adjust the total thickness W1 between the substrate 11 and the field plate 43 by adjusting the thickness of the third sub-insulation film 39 formed on the gate insulation film 13x to optimize the distance from the substrate 11 to the field plate 43 and thereby optimize the reduction of the field concentration occurring at the periphery of the gate electrode 31. As a result, the first embodiment enables the field plate 43 to be used effectively to reduce current collapse in a MIS-HEMT device.

Figure 9:
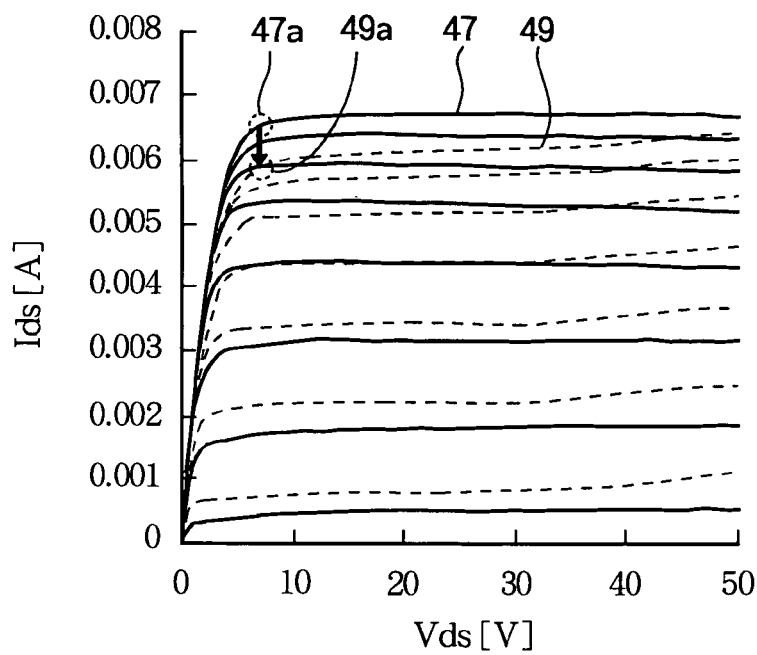
FIG. 9 is a graph showing current-voltage characteristics of the HEMT according to the first embodiment.
Figure 10:
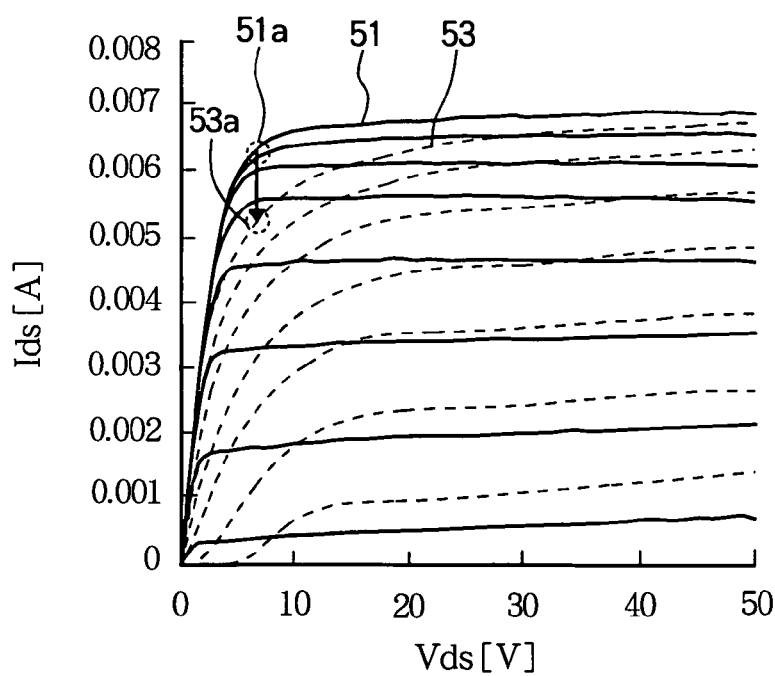
FIG. 10 is a graph showing current-voltage characteristics of a similar HEMT lacking of a field plate.

To evaluate the effect of the field plate, experiments were conducted on MIS-HEMT devices fabricated according to the first embodiment with and without a field plate. FIG. 9 shows results obtained from a MIS-HEMT with a field plate. FIG. 10 shows results obtained from a MIS-HEMT without a field plate. In both drawings, the vertical axis represents drain-source current (Ids) in amperes and the horizontal axis represents drain-source voltage (Vds) in volts.

The only structural difference between the two MIS-HEMT devices used in the experiments was the presence or absence of the field plate. The data shown in FIGS. 9 and 10 were measured under the same conditions. For the MIS-HEMT with the field plate, the sub-insulation film 33 was 100 nm thick.

The measurements were made by applying a pulsed voltage having a pulse cycle of sixty milliseconds (60 ms) and a pulse width of six milliseconds (6 ms). Data were taken with gate-source voltages (Vgs) ranging from three volts to minus five volts (+3 V to −5 V) in steps of one volt. The solid curves in FIGS. 9 and 10 were obtained under normal conditions in which no voltage (0 V) was applied in the standby state preceding each pulse. The dashed curves were obtained under stressed conditions conducive to current collapse, in which the drain-source voltage Vds was set to 50 volts and the gate-source voltage Vgs was set to −5 volts in the standby state.

The solid curve 47 and dashed curve 49 in FIG. 9 were measured at a gate-source voltage of three volts (Vgs=+3 V). The knees 47a, 49a of these curves 47, 49 occur at drain-source voltages of about six volts (Vds=6 V). At the knee point 49a in the stressed condition, the drain current (Ids) was approximately 14% lower than at the knee point 47a in the normal condition, the difference being indicated by the arrow in FIG. 9. This 14% current difference is due to current collapse.

The corresponding curves 51, 53 in FIG. 10, also measured at a gate-source voltage of three volts (Vgs=+3 V), had knees 51a, 53a that occurred at the same drain-source voltage of about six volts (Vds=6 V). At the knee point 53a in the stressed condition, the drain current (Ids) was approximately 25% lower than at the knee point 51a in the normal condition. That is, when the field plate was absent the current collapse was nearly twice as great, as indicated by the longer arrow in FIG. 10.

From the above results, it is apparent that a semiconductor device fabricated according to the first embodiment, having a MIS-HEMT structure with a field plate, has significantly less current collapse than a comparable semiconductor device having a MIS-HEMT structure without a field plate.

Simulations were performed on the semiconductor device according to the first embodiment to find the optimum distance from the field plate to the substrate for reducing current collapse.

Figure 11:
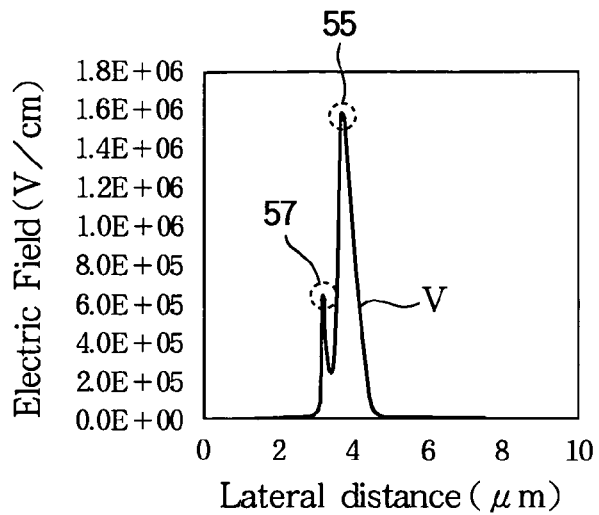
FIGS. 11 to 13 are graphs showing Electric field strength distributions in the HEMT according to the first embodiment.
Figure 12:
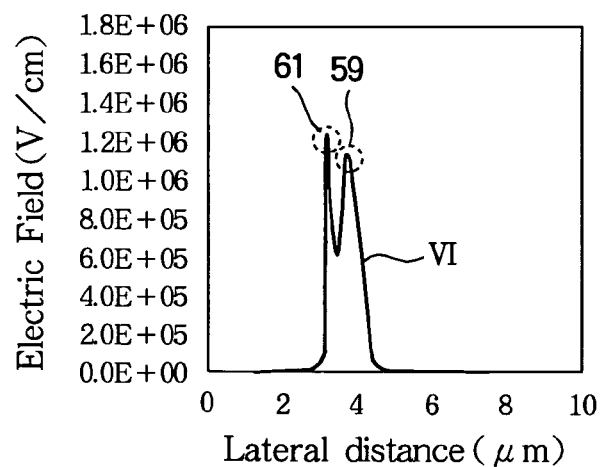
Figure 13:
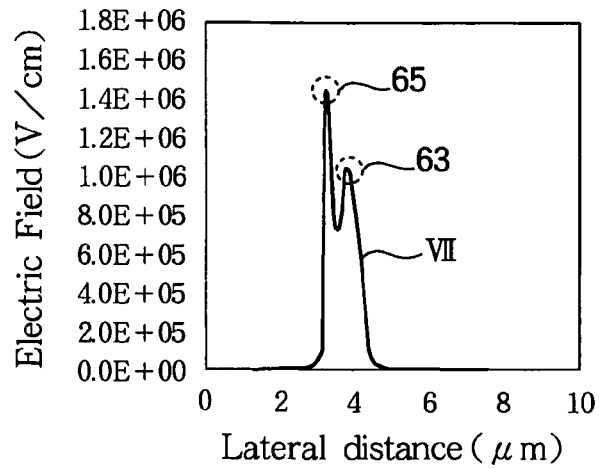

FIGS. 11 to 13 show simulated field strength distributions of semiconductor devices according to the first embodiment having different distances from the field plate to the upper surface of the substrate: for the simulation in FIG. 11 the distance was 50 nm, corresponding to a third sub-insulation film 45 nm thick and a gate insulation film 5 nm thick; for the simulation in FIG. 12 the distance was 150 nm, corresponding to a third sub-insulation film 145 nm thick and a gate insulation film 5 nm thick; for the simulation in FIG. 13 the distance was 200 nm, corresponding to a third sub-insulation film 195 nm thick and a gate insulation film 5 nm thick.

In FIGS. 11 to 13, the vertical axis represents field strength in volts per centimeter; the horizontal axis represents distance in micrometers in the gate length direction. Curves V, VI, and VII show the field strength distributions, which have respective peaks 55, 59, and 63 at the edge of the field plate on the drain electrode side and respective peaks 57, 61, and 65 at the edge of the gate electrode on the drain electrode side.

A comparison of these field strength distributions shows that the maximum peak field strength is lowest when the distance from the field plate to the substrate is 150 nm as in FIG. 12. With this distance the peak at the edge of the gate electrode and the peak at the edge of the field plate have substantially the same height. Changing this distance makes one peak lower and the other higher, thereby increasing the maximum peak height as shown in FIGS. 11 and 13. The field concentration on the drain side of the gate electrode can accordingly be minimized, thereby minimizing current collapse, by setting the distance from the field plate to the upper surface of the substrate to substantially 150 nm.

Accordingly, as noted above, the total thickness of the gate insulation film 13x and the third sub-insulation film 39 formed in the fifth step in FIG. 5 is preferably about 150 nm. If the gate insulation film 13 is 5 nm thick, the third sub-insulation film 39 should be substantially 145 nm thick.

Second Embodiment

The MIS-HEMT in the second embodiment also includes a field plate formed on a sub-insulation film, but differs from the first embodiment by providing a larger electrically conducting area between the gate electrode and the field plate. The first five fabrication steps are the same as in the first embodiment, but the last step, corresponding to the sixth step in the first embodiment, is different. Only this last step will be described, with reference to FIGS. 14 to 17.

Figure 14:
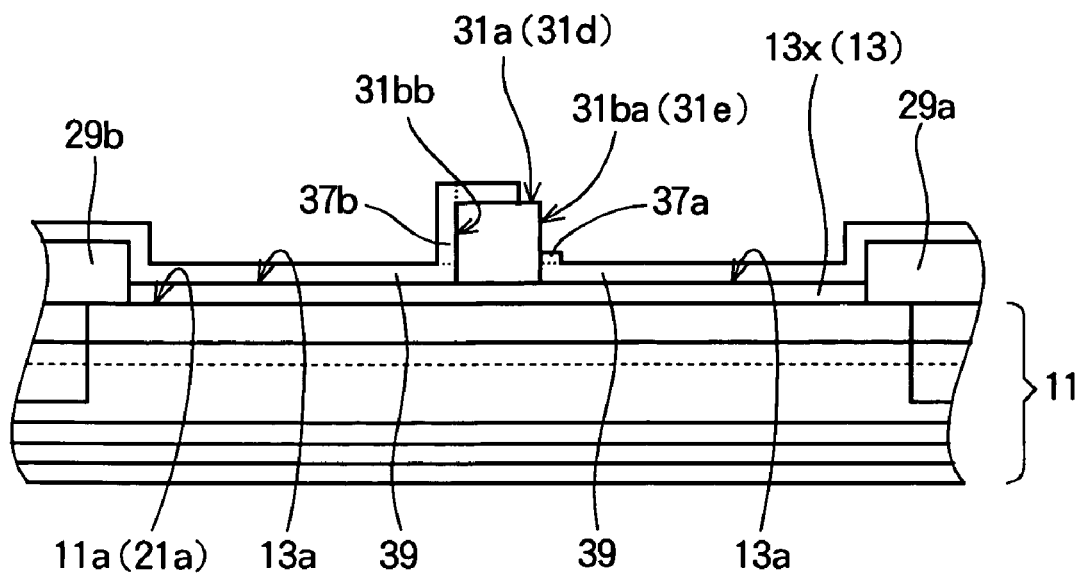
FIGS. 14 and 15 are sectional views showing two steps in the fabrication of a HEMT according to a second embodiment of the invention.
Figure 16:
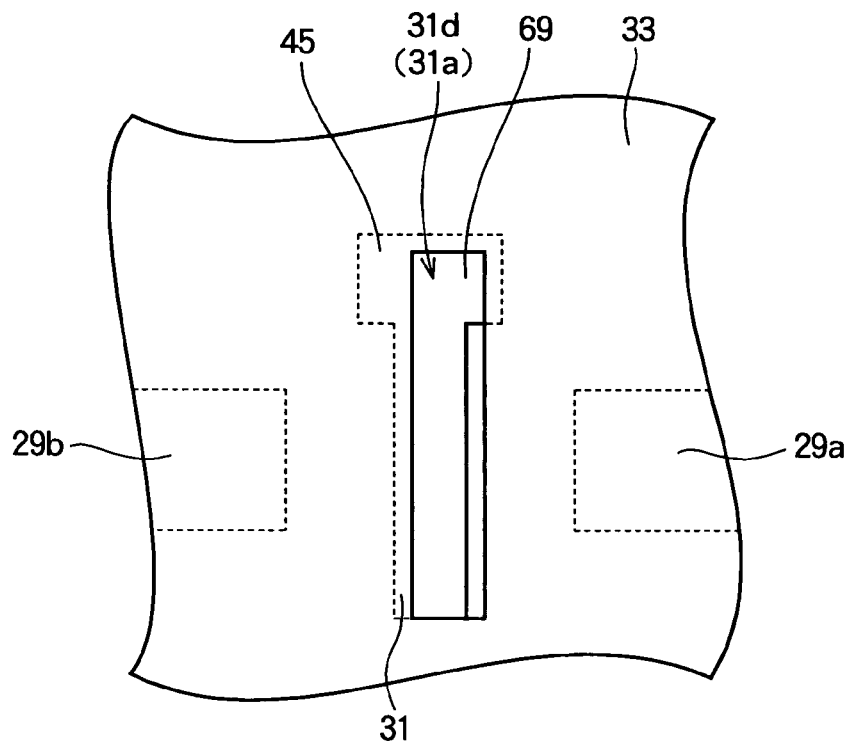
FIGS. 16 and 17 are plan views showing the step in FIG. 14.

In the sixth step in the second embodiment, the first sub-insulation film 35 on top of the gate electrode 31 is partly removed as in the first embodiment, but the second sub-insulation film 37a on the drain side of the gate electrode is almost entirely removed as shown in FIG. 14, forming the large opening 69 seen in FIG. 16. The removal is effected by a dry etching process that exposes part of the upper surface 31a of the gate electrode 31 and one of its side surfaces 31ba, 31bb, forming exposed surfaces 31d, 31e as indicated in FIGS. 14 and 16. These exposed surfaces 31d, 31e allow a large area of electrical contact between the gate electrode 31 and the field plate 67.

Figure 15:
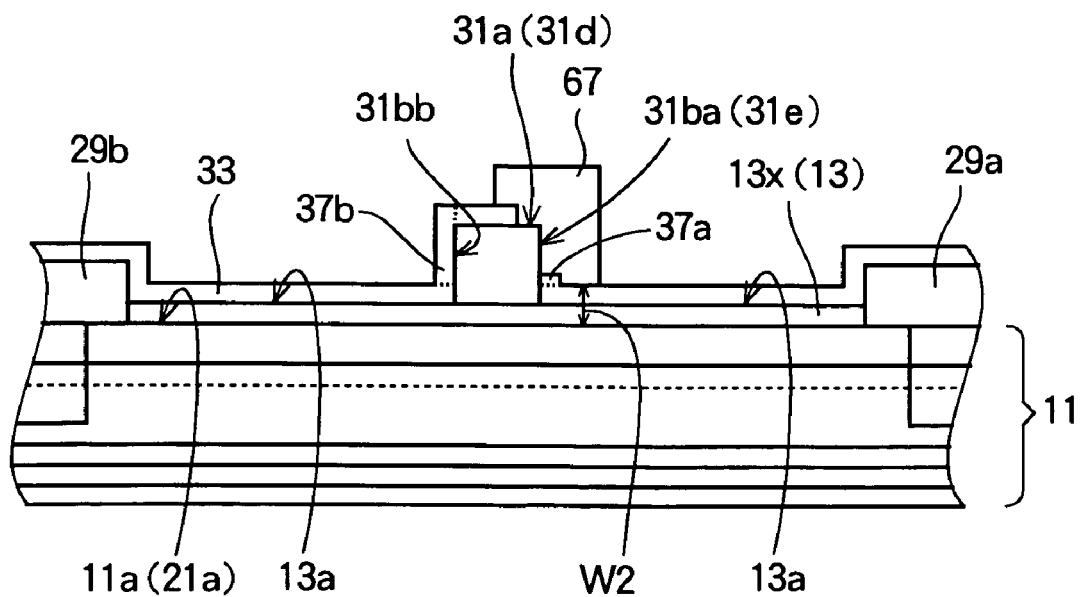
Figure 17:
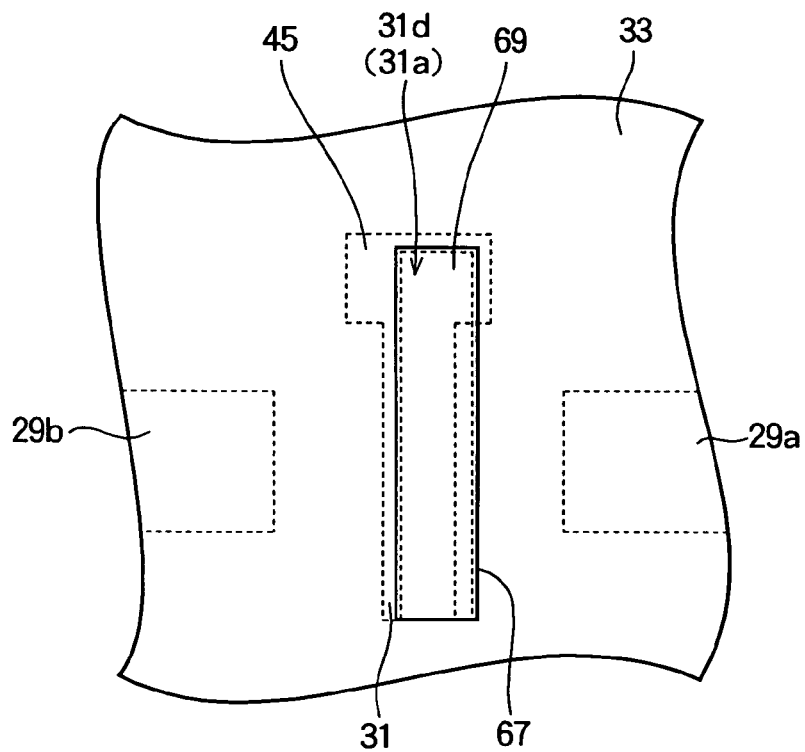

The field plate 67 is formed as shown in FIGS. 15 and 17 by, for example, electron beam deposition of titanium (Ti), platinum (Pt), and gold (Au). As in the first embodiment, the field plate 67 is formed so as to cover the side 31ba of the gate electrode 31 facing the drain electrode 29a and adjacent regions on the upper surface 31a of the gate electrode and the sub-insulation film 33. That is, the field plate 67 is formed so that it continuously covers the exposed surfaces 31d and 31e and the third sub-insulation film 39 on one side of the gate electrode 31, forming the structure shown in FIGS. 15 and 17.

As in the first embodiment, the field plate 67 is separated from the upper surface 11a of the substrate 11, (the upper surface 21a of the AlGaN layer 21) by an amount equal to the total thickness W2 of the third sub-insulation film 39 and the gate insulation film 13x.

In the second embodiment, the field plate 67 is entirely formed within the opening 69 of the sub-insulation film 39. Electrical contact between the field plate 67 and gate electrode 31 accordingly does not depend on the filling of a comparatively small opening with metal material; a large part 31d of the upper surface 31a and nearly the entire part 31e of one side surface 31ba or 31bb of the gate electrode 31 are in direct electrical contact with the field plate 67. This establishes a much larger region of electrical conduction between the field plate 67 and the gate electrode 31 than in the first embodiment. As a result, in addition to the effects obtained in the first embodiment, the second embodiment has the effect of reducing the capacitance between the field plate 67 and the gate electrode 31. This is particularly beneficial when, for example, the transistor must operate at a high frequency.

The fabrication processes in the first and second embodiments may include other steps, such as steps for forming interconnections between the source, gate, and drain electrodes and wiring patterns or leads (not shown).

The invention is not limited to these fabrication processes or to the materials mentioned in them.

Those skilled in the art will recognize that further variations are possible within the scope of the invention, which is defined in the appended claims.

What is claimed is:

1. A semiconductor device comprising:
a substrate;
a first main electrode and a second main electrode spaced apart and facing each other on a surface of the substrate;
a gate insulation film formed on the surface of the substrate exposed between the first main electrode and the second main electrode;
a gate electrode formed on the gate insulation film between the first main electrode and the second main electrode, the gate electrode having a top surface, a first side facing the first main electrode and, and a second side facing the second main electrode, the gate electrode having a vertical thickness measured from the top surface to the gate insulation film;
a sub-insulation film having a thickness less than the vertical thickness of the gate electrode, the sub-insulation film continuously covering substantially all exposed surfaces of the substrate, the first main electrode, the second main electrode, the gate insulation film, and the gate electrode, the sub-insulation film including a first sub-insulation film at least partially covering the top surface of the gate electrode, a second sub-insulation film covering at least the second side of the gate electrode, and a third sub-insulation film covering the gate insulation film where not covered by the gate electrode, the sub-insulation film having an opening partially exposing the gate electrode; and
a field plate making electrical contact with the gate electrode by filling the opening in the sub-insulation film, the field plate extending from above the top surface of the gate electrode down the first side of the gate electrode to the third sub-insulation film.

2. The semiconductor device of claim 1, wherein the gate insulation film and the third sub-insulation film have a combined thickness of substantially 150 nanometers.

3. The semiconductor device of claim 1, wherein the gate insulation film has a thickness of substantially 5 nanometers and the third sub-insulation film has a thickness of substantially 145 nanometers.

4. The semiconductor device of claim 1, wherein the sub-insulation film comprises silicon nitride.

5. The semiconductor device of claim 1, wherein the field plate comprises at least one of titanium, platinum, and gold.

6. The semiconductor device of claim 1, wherein the semiconductor device is a high electron mobility transistor.

7. The semiconductor device of claim 1, wherein the second sub-insulation film also covers the first side of the gate electrode, intervening between the gate electrode and the field plate.

8. The semiconductor device of claim 7, wherein the gate electrode has an elongated shape with an enlarged end, and the opening is formed in the first sub-insulation film on the enlarged end.

9. The semiconductor device of claim 1, wherein the opening exposes substantially all of the first side of the gate electrode.

10. The semiconductor device of claim 9, wherein the opening also exposes a part of the top surface of the gate electrode adjacent to the first side of the gate electrode.

11. The semiconductor device of claim 10, wherein the field plate is formed within the opening.

* * * * *